United States Patent [19]
Yajima

[11] Patent Number: 5,410,742
[45] Date of Patent: Apr. 25, 1995

[54] SAW ELECTRIC PART AND FREQUENCY CONVERSION CIRCUIT

[75] Inventor: Kotaro Yajima, Tokyo, Japan

[73] Assignee: Kinseki, Limited, Tokyo, Japan

[21] Appl. No.: 195,904

[22] Filed: Feb. 14, 1994

Related U.S. Application Data

[63] Continuation of Ser. No. 725,206, Jul. 3, 1991, abandoned.

[30] Foreign Application Priority Data

Jul. 9, 1990 [JP] Japan ............................... 2-179480

[51] Int. Cl.⁶ ...................... H04B 1/16; H01L 41/08; H03H 9/25
[52] U.S. Cl. ............................ 455/316; 455/339; 455/340; 333/193; 333/155; 310/313 R
[58] Field of Search ................ 333/193, 196, 155; 310/313 R, 313 B, 313 C, 313 D; 331/107 A; 455/316, 317, 318, 255, 258, 259, 265, 339, 260, 314, 315, 338, 340

[56] References Cited

U.S. PATENT DOCUMENTS

| | | | |
|---|---|---|---|
| 3,787,612 | 1/1974 | DeVries et al. | 455/259 |
| 4,100,498 | 7/1978 | Alsup et al. | 331/107 A |
| 4,489,289 | 12/1984 | Slobodnik et al. | 331/107 A |
| 4,509,165 | 2/1985 | Tamura | 333/194 |
| 4,683,495 | 7/1987 | Erickson | 331/17 |
| 4,734,664 | 3/1988 | Hikita et al. | 333/194 |
| 4,739,286 | 4/1988 | Snow et al. | 333/194 |
| 4,811,096 | 3/1989 | Gakumura | 331/17 |
| 4,871,984 | 10/1989 | Laton et al. | 331/107 A |
| 4,978,879 | 12/1990 | Satoh et al. | 333/194 |

OTHER PUBLICATIONS

Information Transmission, Modulation, and Noise, Misha Schwartz, ©1959, 1970, pp. 198–199, McGraw-Hill Book Company.

*Primary Examiner*—Reinhard J. Eisenzopf
*Assistant Examiner*—Nguyen Vo
*Attorney, Agent, or Firm*—Blakely, Sokoloff, Taylor & Zafman

[57] ABSTRACT

According to this invention, an SAW electric part includes an SAW filter and an SAW oscillator formed on a substrate having the same temperature characteristics as those of a substrate on which the SAW filter is formed. A frequency converter includes the SAW electric part, a second local oscillation circuit, a frequency converter, a first mixer, and a second mixer. The second local oscillation circuit oscillates a second local oscillation signal using the SAW oscillator. The frequency converter converts a frequency of the second local oscillation signal to generate a first local oscillation signal. The first mixer mixes the first local oscillation signal with an input signal to output a composite signal to the SAW filter. The second mixer mixes an output from the SAW filter with the second local oscillation signal to output a frequency conversion signal.

5 Claims, 1 Drawing Sheet

SAW ELECTRIC PART AND FREQUENCY CONVERSION CIRCUIT

This is a continuation of application Ser. No. 07/725,206, filed Jul. 3, 1991, now abandoned.

BACKGROUND OF THE INVENTION

The present invention relates to an SAW (surface acoustic wave) electric part and a frequency conversion circuit using SAW parts.

In recent years, filters have been used in parts of a device. For example, as shown in FIG. 2, a plurality of filters are used in a receiver. In FIG. 2, an electric wave received by an antenna 1 is supplied to a frequency mixer 6 through a band-pass filter (BPF) 2 and an amplifier 3. A first local oscillation signal generated by a PLL oscillator 4 is supplied to the frequency mixer 6 through a BPF 5. The reception signal and the first local oscillation signal are mixed with each other, and a signal having the output frequency is output through a BPF 7, thereby obtaining a first intermediate frequency signal. This first intermediate frequency signal is mixed with a second local oscillation signal supplied from a second local oscillation circuit 8, and the output signal is output from a BPF 10 to obtain a second intermediate frequency signal. The second intermediate frequency signal is amplified by an amplifier 11 and output.

In recent years, lightweight, low-profile, compact devices are preferably used. Compact receivers are strongly demanded. The BPF 7 has a proper frequency to be constituted by an SAW filter. When the BPF 7 is constituted by the SAW filter, the BPF 7 can be formed to be compact. The BPF using the SAW filter is proposed.

However, the SAW filter has degraded temperature characteristics, the center frequency of the filter is shifted due to a change in temperature. Although it is considered that temperature is kept to be constant by a thermostat, this method requires a large space to disable realization of a compact BPF. Although a band-pass width may be increased to cope with the degraded temperature characteristics, when the width is increased, an adjacent channel cannot be cut off. In addition, if a group delay characteristic curve is not flat, a pulse waveform is distorted in digital communications, thereby degrading the reliability of the digital communications. It is difficult to flatten the group delay characteristic curve in a wide range. On the other hand, a local oscillation frequency may be changed in accordance with a change in frequency of the filter to always equalize the output frequency of a frequency conversion circuit to the center frequency of the filter. However, the frequency shift of the SAW filter cannot be easily detected. If it can be detected, the local oscillation frequency cannot be easily controlled using the detection result.

SUMMARY OF THE INVENTION

It is an object of the present invention to provide a frequency conversion circuit capable of obtaining a stable output even when a frequency shift of a filter occurs due to a change in temperature.

It is another object of the present invention to provide a frequency conversion circuit capable of using an SAW filter having a narrow band width.

In order to achieve the above objects according to the present invention, there is provided an SAW electric part comprising an SAW filter and an SAW oscillator formed on a substrate having the same temperature characteristics as those of a substrate on which the SAW filter is formed.

Since the SAW filter and the SAW oscillator have similar structures, the frequency characteristics of the SAW filter are thermally changed, similar to the frequency characteristics of the SAW oscillator. For this reason, a change in local oscillation frequency has a value close to a change in frequency of the filter, a signal supplied to the filter always has its center frequency.

DESCRIPTION OF THE PREFERRED EMBODIMENT

Figure 1:
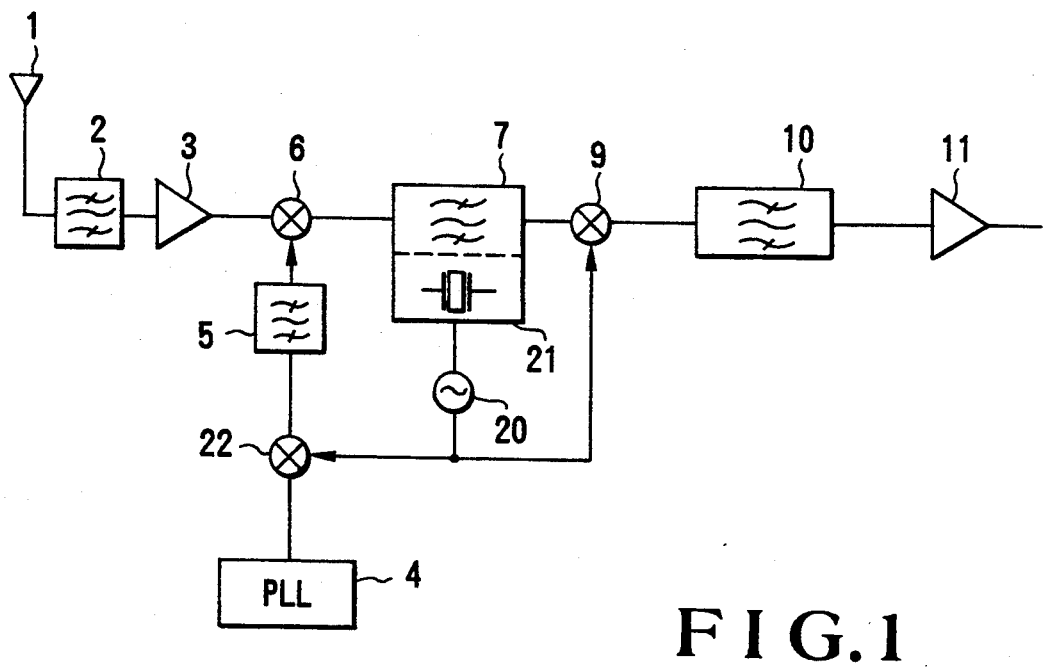
FIG. 1 is a block diagram showing an embodiment of the present invention.
Figure 2:
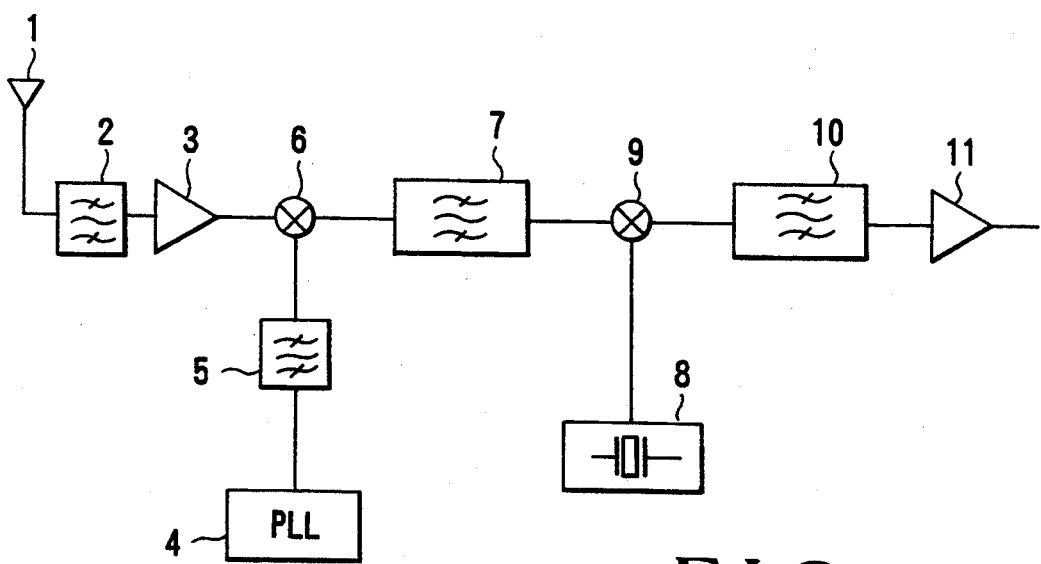
FIG. 2 is a block diagram showing a conventional device.

FIG. 1 is a block diagram showing an embodiment of the present invention, and the same reference numerals as in FIG. 2 denote the same parts in FIG. 1. Referring to FIG. 1, a second local oscillation circuit 20 in combination with a SAW oscillator 21 oscillates a signal having a second local oscillator frequency. The SAW oscillator is formed on a substrate on which an SAW filter 7 is formed. A mixer 22 mixes a signal generated by a PLL oscillator 4 with a signal having the second local oscillation frequency. An output signal from the mixer 22 is output to a BPF 5, so that a signal from the BPF has a first local oscillation frequency. Note that the mixer 22 and the PLL oscillator 4 constitute a frequency conversion circuit.

In the device arranged as described above, it is assumed that a reception frequency is set at 800 MHz, that a first intermediate frequency is set at 80 MHz, and that a second intermediate frequency is set at 450 kHz. In this case, the first local oscillation frequency is set to 720 MHz lower than 800 MHz by 80 MHz, the second local oscillation frequency is set to 79.55 MHz lower than 80 MHz by 450 kHz, and the oscillation frequency of the PLL oscillator 4 is set to 799.55 MHz lower than 800 MHz by 450 kHz.

At this time, when the center frequency of the SAW filter is decreased by 20 kHz from 80 MHz to 79.98 MHz, since the oscillator having the same structure as that of the filter is formed on the substrate on which the filter is formed, a change in frequency of the oscillator has the same characteristics as those of a change in frequency of the filter. For this reason, the second local oscillation frequency is decreased by about 20 kHz from 79.55 MHz to 79.53 MHz.

When the oscillation frequency of the PLL 4 is not influenced by temperatures, the first local oscillation frequency output from the BPF 5 is 799.55 MHz−79.53 MHz=720.02 MHz. Therefore, a signal output from the mixer 6 has a frequency of 800 MHz−720.02 MHz=79.98 MHz. This value is equal to the changed frequency of the SAW filter 7. That is, although the center frequency of the SAW filter 7 is changed in accordance with temperatures, the frequency supplied to the filter 7 has the same center frequency as the filter 7. As a result, the SAW filter 7 outputs a signal having the center frequency of the filter 7.

The first intermediate frequency supplied to a mixer 9 is changed from 80 MHz to 79.98 MHz, and the second local oscillation frequency is changed from 79.55 MHz to 79.53 MHz. Therefore, a second center frequency is 79.88 MHz−79.53 MHz=450 kHz, and this value is equal to the frequency of the SAW filter which is not changed. For this reason, even when the first intermediate frequency is changed, the second intermediate frequency remains constant under constant PLL oscillator and reception signal frequencies despite of variations in the frequency of the SAW filter and the SAW oscillator, and a reception operation is normally performed.

In the above embodiment, although the SAW filter and the SAW oscillator are formed on the same substrate, they may be independently formed on piezoelectric substrates having the same cut angle. In addition, when substrates are formed to have the same temperature characteristics, different types of substrates may be used. The present invention can be applied to not only a receiver, but the transmitting side of a transceiver and a signal generator of the receiving side of the transceiver. The present invention can be generally used in a signal generating part.

As described above, according to the present invention, the change in frequency of the SAW filter is equal to that of the SAW oscillator, and a signal supplied to the SAW filter is always set to be the center frequency of the filter. Therefore, a special countermeasure against a frequency shift is not required, and an SAW filter having a narrow band width can be advantageously used.

What is claimed is:

1. A frequency conversion circuit comprising:
   a SAW filter;
   a SAW oscillator having the same temperature characteristics as those of said SAW filter;
   a second local oscillation oscillator for oscillating a second local oscillation signal using said SAW oscillator to modify a frequency of a first intermediate signal inputted into said SAW filter with respect to variations in the center frequency of said SAW filter's bandwidth caused by temperature changes;
   a frequency converter for converting a frequency of the second local oscillation signal to generate a first local oscillation signal, said frequency converter comprising a first mixer and a stable oscillator, wherein the second local oscillator and the stable oscillator are coupled to said first mixer for producing the first local oscillation signal;
   a second mixer for mixing the first local oscillation signal with an input signal to output the first intermediate frequency signal to said SAW filter; and
   a third mixer for mixing an output from said SAW filter with the second local oscillation signal to output a stable frequency conversion signal regardless of a frequency shift in said SAW filter due to a change in temperature.

2. A frequency conversion circuit according to claim 1, wherein said SAW filter and said SAW oscillator are jointly formed on a substrate.

3. A frequency conversion circuit according to claim 1, wherein said SAW filter and said SAW oscillator are jointly formed on a piezoelectric substrate.

4. A frequency conversion circuit according to claim 1, wherein said SAW filter is formed on a first piezoelectric substrate having a predetermined cut angle and said SAW oscillator is formed on second piezoelectric substrate having the same cut angle.

5. A frequency conversion circuit comprising:
   a SAW filter;
   a SAW oscillator having the same temperature characteristics as said SAW filter;
   a second local oscillator for oscillating a second local oscillation signal using said SAW oscillator to modify a frequency of a first intermediate signal inputted into said SAW filter with respect to variations in the center frequency of said SAW filter's bandwidth caused by temperature changes;
   a frequency converter for converting a frequency of the second local oscillation signal to generate a first local oscillation signal, said frequency converter comprises a first mixer and a phase lock loop oscillator wherein the second local oscillator and the phase lock loop oscillator are coupled to said first mixer for producing the first local oscillation signal;
   a second mixer for mixing the first local oscillation signal with an input signal to output the first intermediate frequency signal to said SAW filter; and
   a third mixer for mixing an output from said SAW filter with the second local oscillation signal to output a stable frequency conversion signal regardless of a frequency shift in said SAW filter due to a change in temperature.

* * * * *